(12) United States Patent
Epshteyn

(10) Patent No.: US 6,502,271 B1
(45) Date of Patent: Jan. 7, 2003

(54) METHOD AND APPARATUS FOR CLEANING WORKPIECES WITH UNIFORM RELATIVE VELOCITY

(75) Inventor: Yakov Epshteyn, Phoenix, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

(21) Appl. No.: 09/492,020

(22) Filed: Jan. 26, 2000

(51) Int. Cl.[7] ............................................... A46B 13/02
(52) U.S. Cl. ..................... 15/77; 211/88.2; 211/88.3; 211/102
(58) Field of Search ................... 15/77, 21.1, 102, 15/88.2, 88.3

(56) References Cited

U.S. PATENT DOCUMENTS

| 3,792,503 A | * | 2/1974 | Brock |
| 4,730,360 A | * | 3/1988 | Brugelmann |
| 5,144,711 A |   | 9/1992 | Gill, Jr. |
| 5,950,327 A | * | 9/1999 | Peterson |

FOREIGN PATENT DOCUMENTS

| FR | 2589089 | * | 4/1987 |
| GB | 577450 |   | 5/1946 |
| GB | 859575 | * | 1/1961 |
| JP | 0099353 | * | 8/1979 |
| SU | 521032 | * | 9/1976 |

\* cited by examiner

*Primary Examiner*—Randall E. Chin
(74) *Attorney, Agent, or Firm*—Snell & Wilmer, L.L.P.

(57) ABSTRACT

A method and apparatus for cleaning a wafer in a dual brush cleaning system is disclosed. Two brushes, preferably made of PVA and wetted by cleaning fluids, are positioned opposite one another and spaced apart enough to allow a portion of a wafer to be inserted between their working surfaces and make frictional engagement with them. The top brush is rotated at a first speed and the bottom brush is rotated at a second faster speed sufficient for the freely rotating wafer to rotate at the same speed and in the same direction as the top brush. The bottom brush may have raised areas on its surface to assist in efficiently gripping and rotating the wafer. A common rotation speed and direction causes a uniform relative velocity between the top brush and the wafer that results in an improved cleaning operation.

8 Claims, 5 Drawing Sheets

METHOD AND APPARATUS FOR CLEANING WORKPIECES WITH UNIFORM RELATIVE VELOCITY

TECHNICAL FIELD

The present invention relates generally to the art of cleaning workpieces such as semiconductor wafers during various stages in the manufacturing process of integrated circuits, and more particularly, relates to an improved method and apparatus whereby a freely rotating wafer is cleaned between two adjacent motor driven brushes wherein there is a substantially uniform relative velocity distribution between the top brush and the wafer's surface.

BACKGROUND OF THE INVENTION

A flat disk or "wafer" of single crystal silicon is the basic substrate material in the semiconductor industry for the manufacture of integrated circuits. Semiconductor wafers are typically created by growing an elongated cylinder or boule of single crystal silicon and then slicing individual wafers from the cylinder.

Several of the processes used to manufacture semiconductor wafers introduce particles or contaminates to the surfaces of the wafer. For example, chemical-mechanical polishing (CMP) involves placing the wafer on a polishing pad in the presence of slurry. Slurry typically contains chemicals that etch away material from the wafer's surface and abrasive particles that assist in mechanically removing material from the wafer's surface. Slurry may contain, for example, KOH and colloidal or fumed silica abrasive particles. The wafer is then pressed against the polishing pad and relative motion is created between the wafer's surface and the polishing pad to remove material from the wafer's surface. The wafer's surface is thereby exposed not only to the chemicals and particles contained in the slurry, but also to material removed from the wafer's surface. The process of pressing and causing relative motion between the wafer's surface and these contaminates undesirably adheres the contaminates to the wafer's surface.

The wafer's surface on which integrated circuitry is to be constructed must be extremely clean in order to facilitate reliable semiconductor junctions with subsequent layers of material applied to the wafer. The material layers (deposited thin film layers, usually made of metals for conductors or oxides for insulators) applied to the wafer while building interconnects for the integrated circuitry must also be made extremely clean to avoid contamination of the circuitry.

Conventional post-CMP wafer cleaning commonly uses a combination of buffing, double-sided brush scrubbing, megasonic cleaning and spin-rinse drying to remove contaminates from the wafer's surface. The present invention relates to double-sided brush scrubbing so buffing, megasonic cleaning and spin-rinse drying, all presently known cleaning techniques, will not be explained in detail so as to not obscure the present invention.

One conventional style of double-sided brush scrubbing is accomplished by placing a freely rotating wafer between the working surfaces of a top and a bottom brush. In conventional cleaning, the top and bottom brushes are rotated by a motor in the same direction and at the same speeds and have the same pattern of raised features on their working surfaces. The motorized rotating top and bottom brushes grip the edge of the freely rotating wafer and cause the wafer to also rotate in the same direction as the brushes.

Applicant has discovered that in conventional cleaners the top brush commonly rotates at about twice the speed of the wafer resulting in a nonuniform relative velocity between the top brush and the wafer across the wafer's surface. The consequences of applicant's discovery are graphically illustrated in FIGS. 2a and 2b. The velocities at various points across the rotating wafer 100 and rotating top brush 101 are represented by the arrows between lines C2 and C3 and lines C1 and C3 respectively. The line C1 representing the speed of top brush 101 is steeper than the line C2 representing the speed of the wafer 100 since, as previously mentioned, the top brush 101 commonly rotates at about twice the speed of the wafer 100. The relative velocity between the top brush 101 and the wafer 100 may be found by subtracting their individual velocities at various points. The relative velocity between the top brush 101 and the wafer 100 is illustrated in FIG. 2b. Specifically, applicant has discovered that as the wafer 100 rotates in a conventional dual brush cleaning system, the relative velocity between the top brush 101 and the wafer 100 is higher near the center and lower near the edge of the wafer 100.

Applicant has further discovered that conventional dual brush cleaning systems typically remove particles satisfactorily from the center of the wafer 100, but often leave a band of contaminates near the edge of the wafer 100. Applicant has thus discovered a need for a dual brush cleaning system with a high uniform (across the entire width of the wafer 100) relative velocity between the top brush 101 and the wafer 100.

What is therefore needed is an apparatus and method of cleaning wafers that produce a high uniform relative velocity between the top brush and the wafer's surface.

SUMMARY OF THE INVENTION

Therefore it is an object of the present invention to provide an apparatus and method for cleaning workpieces that addresses and resolves the shortcomings of the prior art described above. Another object of the present invention is to provide a dual brush cleaning system where all points on the workpiece's surface experience substantially similar top brush velocities during the cleaning process as the workpiece rotates between the brushes.

The apparatus portion of the present invention relates to a dual brush cleaning system for cleaning a workpiece's surface. The cleaning system has two brushes, a top and a bottom, each with a working surface on one end and is advantageously connected to a shaft on the other end. The working surfaces are positioned opposite of each other and spaced apart enough for a workpiece to be placed, gripped and cleaned between them. The shafts for both brushes may be connected to means, such as one or more motors, for rotating the brushes at separate speeds.

The apparatus is preferably able to create the condition of providing a uniform relative velocity between the top brush and the workpiece across the width of the workpiece as the workpiece rotates between the brushes. Sensors may be inserted to monitor in real-time the rotational speeds of the top brush and the workpiece and to then adjust the speed of the bottom brush as needed. However, the cleaning system may be simplified by determining through empirical means the bottom brush speed necessary to obtain a uniform relative velocity between the top brush and the workpiece. Once the desired bottom brush speed has been determined that produces the desired results for a particular application, the bottom brush speed may simply be set at this level.

While the top brush is used primarily to clean the workpiece's top surface, the bottom brush is used primarily (although it also cleans the workpiece's bottom surface) to rotate the workpiece. It is thus important for the working surface of the bottom brush to have an efficient grip on the workpiece to more efficiently rotate the workpiece. Applicant has discovered that a bottom brush with a plurality of nubbs (raised areas) on its working surface may be used to efficiently grip the workpiece and provide the necessary rotational motion to the workpiece.

The method portion of the present invention may be practiced in a dual brush cleaning system by inserting a workpiece, preferably a semiconductor wafer, between the working surfaces of a top and bottom brush. The brushes may be rotated after the workpiece has been inserted, but are preferably already rotating at the speeds necessary to produce a substantially uniform relative velocity between the top brush's working surface and the workpiece's surface.

These and other aspects of the present invention are described in full detail in the following description, claims and appended drawings.

BRIEF DESCRIPTION OF THE DRAWINGS

The present invention will hereinafter be described in conjunction with the appended drawing figures, wherein like numerals denote like elements, and:

FIG. 1b is a side view of the dual brush cleaning system shown in FIG. 1a;

FIG. 2b is a top view of a dual brush cleaning system illustrating the relative velocity of the workpiece and the top brush when the top and bottom brushes rotate at the same speed as in FIG. 2a;

FIG. 3b is a top view of a dual brush cleaning system illustrating the relative velocity of the workpiece and the top brush when the top brush and workpiece rotate at the same speed as in FIG. 1a;

DETAILED DESCRIPTION OF EXEMPLARY EMBODIMENTS

Wafers are often exposed to contaminates during the manufacturing process of integrated circuits. For example, during CMP a wafer is typically pressed against a polishing surface in the presence of chemicals for etching the wafer's surface and abrasive particles for mechanical removing material from the wafer's surface. CMP is thus a particularly dirty process requiring wafers to be cleaned prior to being sent to the next manufacturing step.

A buffing step may be used after CMP to remove the gross contaminates as well as to remove any microscratches present on the wafer's surface. Buffing may be accomplished by lightly pressing, about 1.5 psi, a wafer's surface against a politex pad, made commercially available by Rodel Incorporated from Newark Delaware, in the presence of KOH, mild slurry and/or DI water. The present invention does not require any particular buffing process, but superior cleaning results may be obtained if an effective buffing step is used to remove the gross contaminates prior to the cleaning step.

Figure 1B:
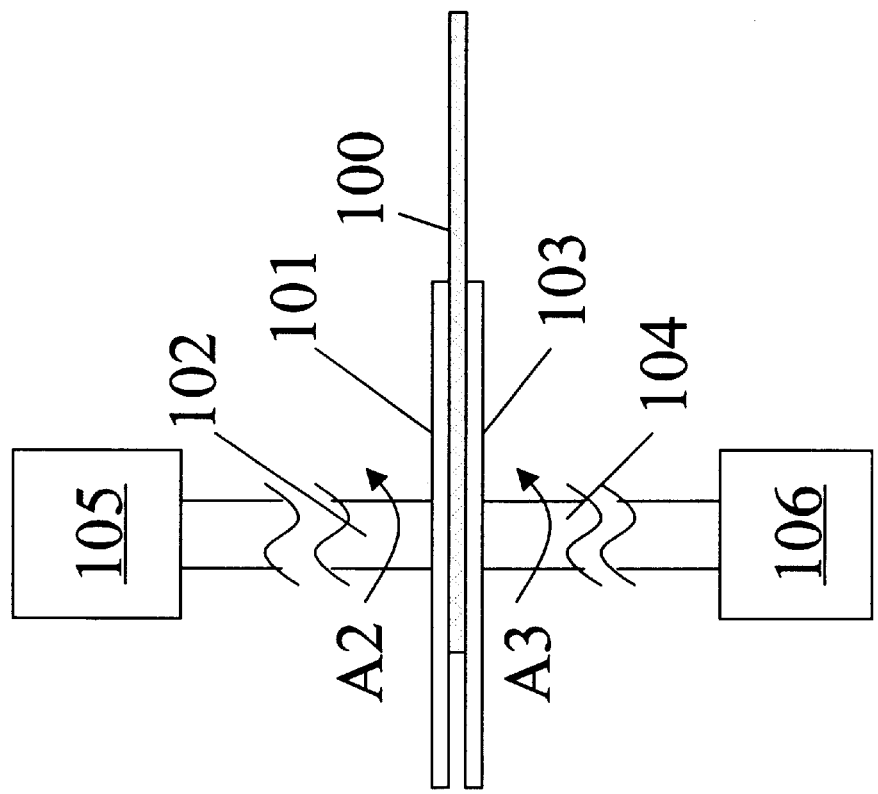
Figure 1A:
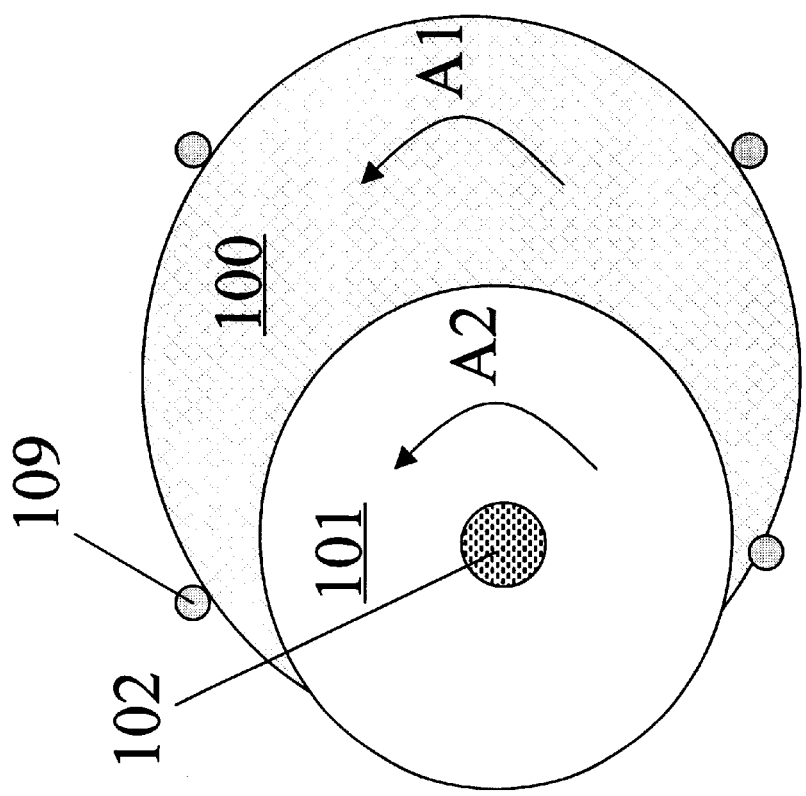
FIG. 1a is a top view of a dual brush cleaning system.
Figure 2B:
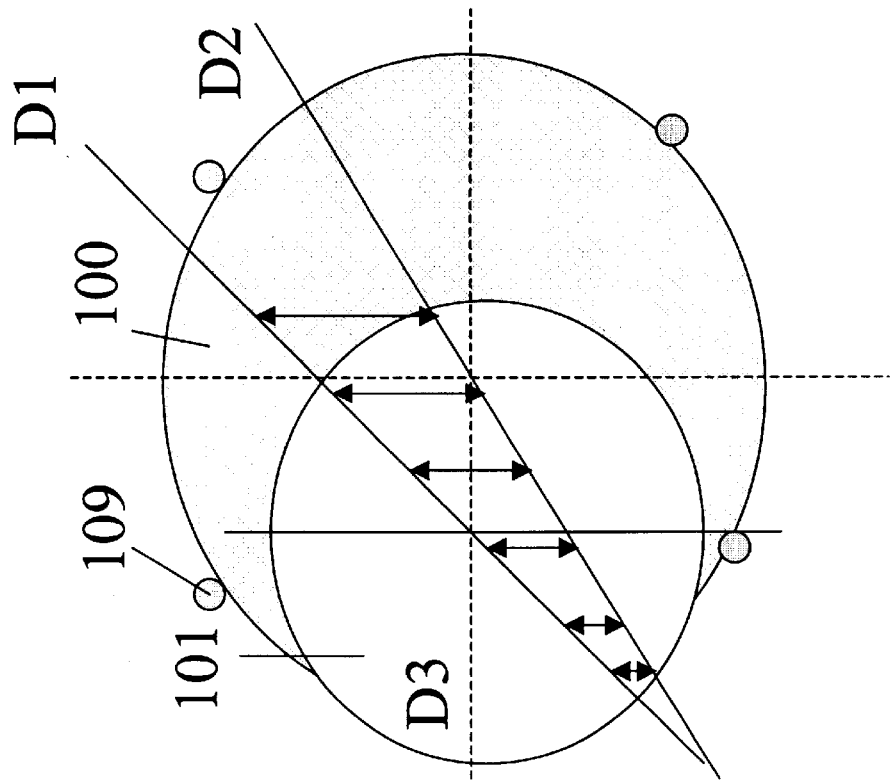
Figure 2A:
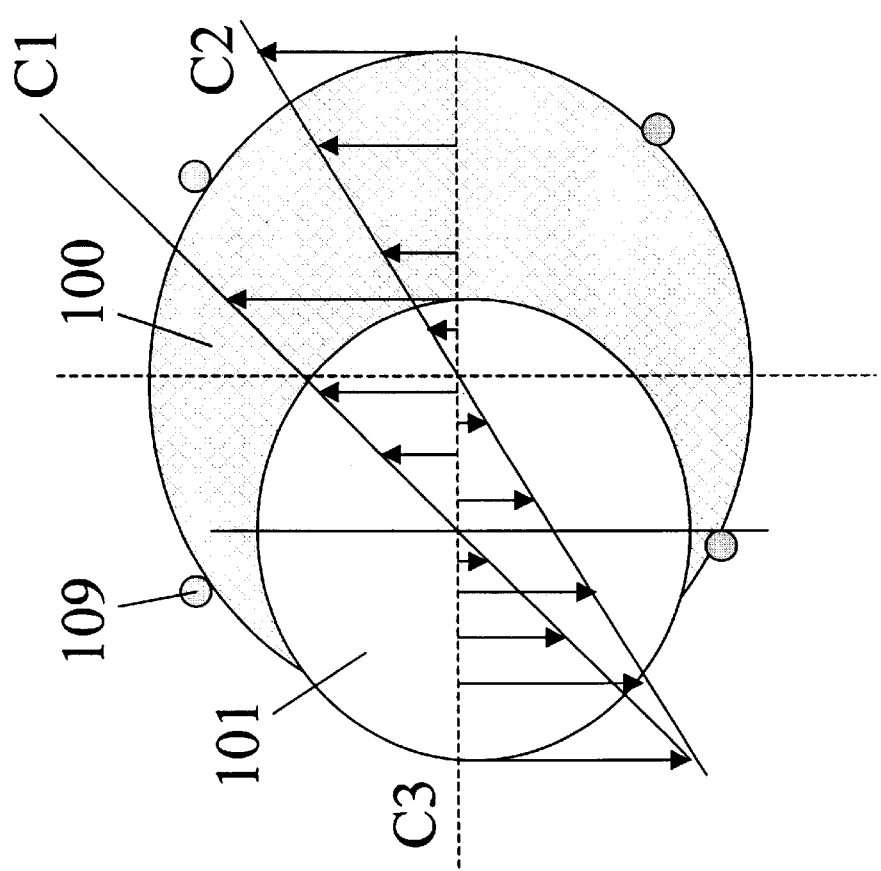
FIG. 2a is a top view of a dual brush cleaning system illustrating the velocity of the workpiece and the velocity of the top brush when the top and bottom brushes rotate at the same speed.

Referring to FIGS. 1a and 1b, the components of an exemplary dual brush cleaning system necessary to practice the present invention will now be discussed in greater detail. The cleaning system has at least two brushes, a top 101 and a bottom 103, each with a working surface on one end and, preferably, a shaft, 102 and 104, connected to the other end. The brushes 101 and 103 may be advantageously made of compressible, porous polyvinyl alcohol (PVA) foam that becomes soft when wet. The brushes 101 and 103 may be disk-shaped with a diameter slightly larger than the radius of the wafer 100. For example, the brushes 101 and 103 preferably have a diameter of about 128 mm for a wafer 100 having a diameter of 200 mm. Syntak Corporation and Rippey Corporation make PVA brushes commercially available that are suitable for practicing the present invention with semiconductor wafers.

The working surfaces of the brushes 101 and 103 are positioned facing each other and close enough so that a wafer 100 placed between the brushes 101 and 103 slightly compresses and makes strong friction engagement with the brushes 101 and 103. The brushes during operation are preferably kept wet to keep the brushes soft and pliant to prevent them from damaging the wafer 100 and to suspend and carry away contaminates that have been liberated from the surface of the wafer 100. For semiconductor wafers, the fluids should primarily comprise DI water, but may also have about 2% $NH_4OH$ by volume.

The shafts 102 and 104 for both brushes 101 and 103 may be connected to means, such as one or more motors 105 and 106, for rotating the brushes 101 and 103 at separate speeds. Another alternative is to connect the motor(s) 105 directly to the brushes, for example, by a belt encircling the brushes 101 and 103. A single motor with gearing mechanisms (not shown) for rotating the brushes 101 and 103 at separate speeds may be used, but preferably both brushes 101 and 103 have an independently controlled motor. The type of motor(s) 105 and 106 is not critical for the present invention, but it is desirable that the motor(s) produce few particles or contaminates. The motor(s) 105 and 106 must also be able to rotate the brushes 101 and 103 at the necessary speeds (typically between 50 and 500 rpm or more) to practice the present invention.

Figure 3B:
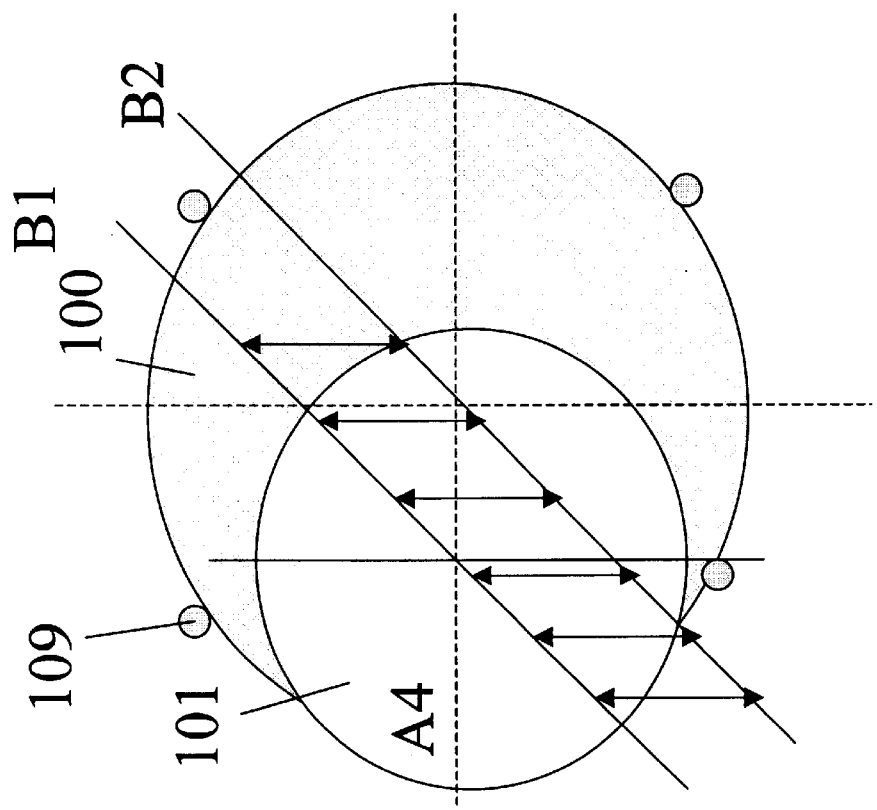
Figure 3A:
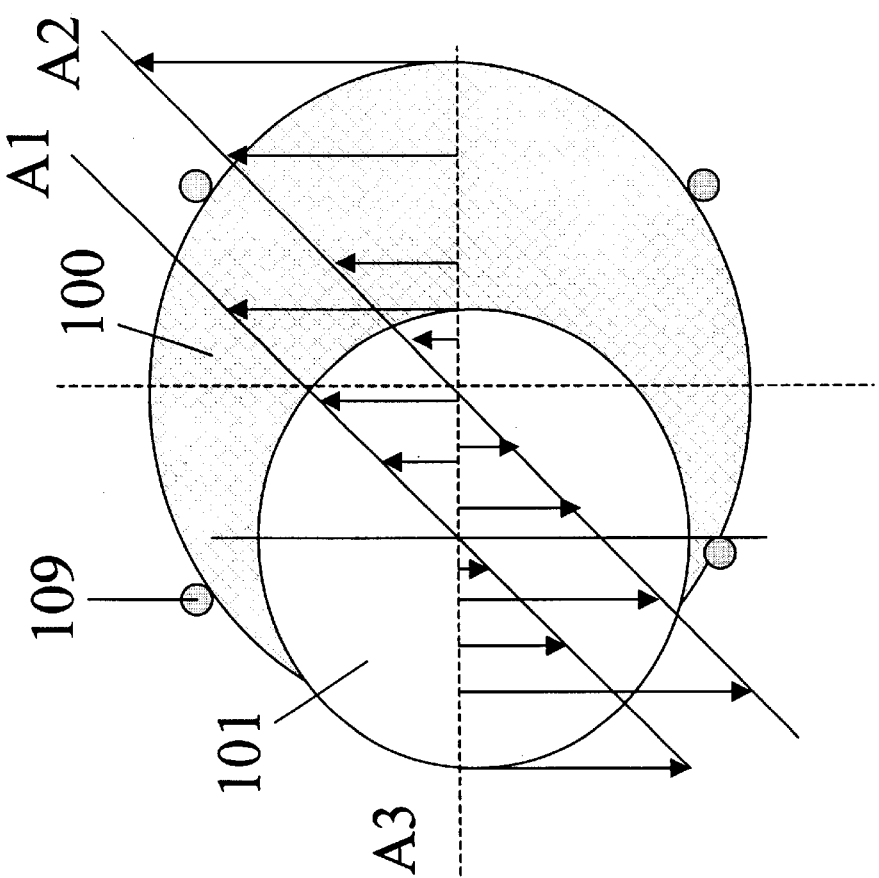
FIG. 3a is a top view of a dual brush cleaning system illustrating the condition of the bottom brush rotating at a speed faster than the speed of the top brush such that the top brush and workpiece rotate at the same speed.

The dual brush cleaning system is advantageously able to create the condition of providing a uniform relative velocity between the top brush 101 and the wafer 100 across the width of the wafer 100 as the wafer 100 rotates between the brushes 101 and 103. This desirable uniform velocity condition is illustrated in FIGS. 3a and 3b. The velocities at various points across the rotating wafer 100 and rotating top brush 101 are represented by arrows between lines A2 and A3 and lines A1 and A3 respectively. The line A1 representing the speed of the top brush 101 has the same slope as line A2 representing the speed of the wafer 100 since a uniform velocity condition may be created when the top brush 101 rotates at the same speed as the wafer 100. The relative velocity between the top brush 101 and the wafer 100 may be found by subtracting their individual velocities at various points. The relative velocity between the top brush 101 and the wafer 100 when both are rotated at the same rpm is illustrated in FIG. 3b. Specifically, Applicant has discovered that when the wafer 100 rotates at the same velocity as the top brush 101, a desirable uniform relative velocity condition is created between the top brush 101 and the wafer 100 across the entire surface of the wafer 100.

The cleaning step of removing contaminates from the wafer's surface relies heavily on mechanical forces, such as those resulting from brush 101 (and brush 103 for the back wafer's surface) contact with contaminates. These forces are determined by the number of brush-particle collisions and the brush-wafer relative speed at the time of the collision. As the number of collisions and the relative speed increases, the opportunities for particle removal also increase. Thus, the length of time the wafer 100 spends between the rotating brushes 101 and 103, the brush pressure against the wafer 100 and the brush rotating speed are all critical in obtaining the best possible cleaning result. In general, the longer the brushing time, the greater the brush pressure and the faster the brush rotating speed, the better the cleaning result. Specifically, a wafer cleaning time of about 80 seconds between a top brush 101 rotating at about 110 rpm and a bottom brush rotating at about 300 rpm with a brush pressure of 3.5 psi has been found to produce acceptable results. These process parameters for PVA brushes 101 and 103 having a diameter of 128 mm, in combination with the brush contours discussed below, have been found to rotate a 200 mm wafer 100 at the same speed as the top brush 101, i.e., 110 rpm.

Sensors may be inserted to monitor in real-time the rotational speeds of the top brush 101 and the wafer 100 and to then adjust the speed of the bottom brush 103 as needed. However, the cleaning system may be simplified by determining through empirical means the bottom brush speed necessary to obtain a uniform relative velocity between the top brush 101 and the wafer 100. Once the desired bottom brush speed has been determined that produces the desired results for a particular application, the bottom brush speed may simply be set to this level.

Figure 4B:
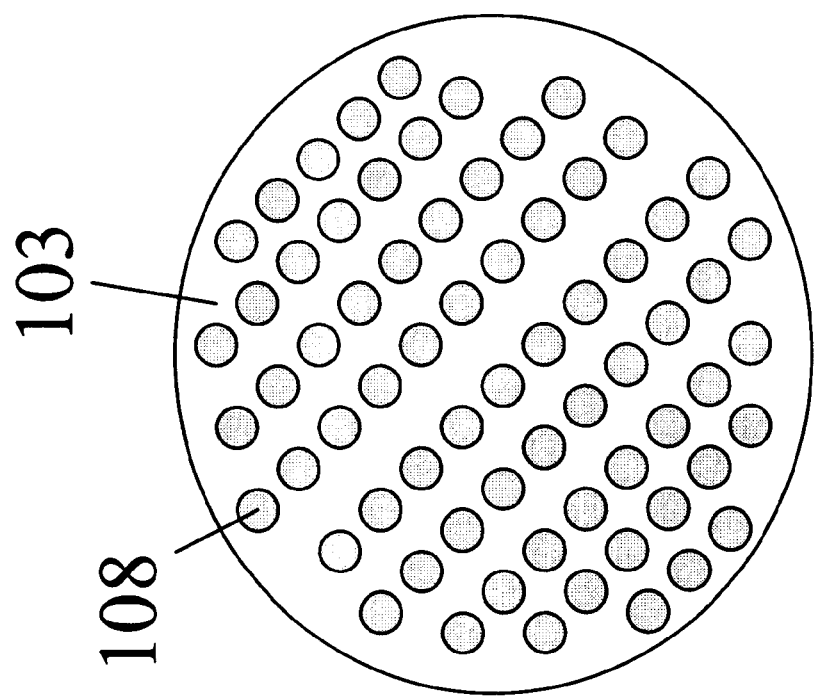
FIG. 4b is a top view of a preferred working surface for the bottom brush.
Figure 4A:
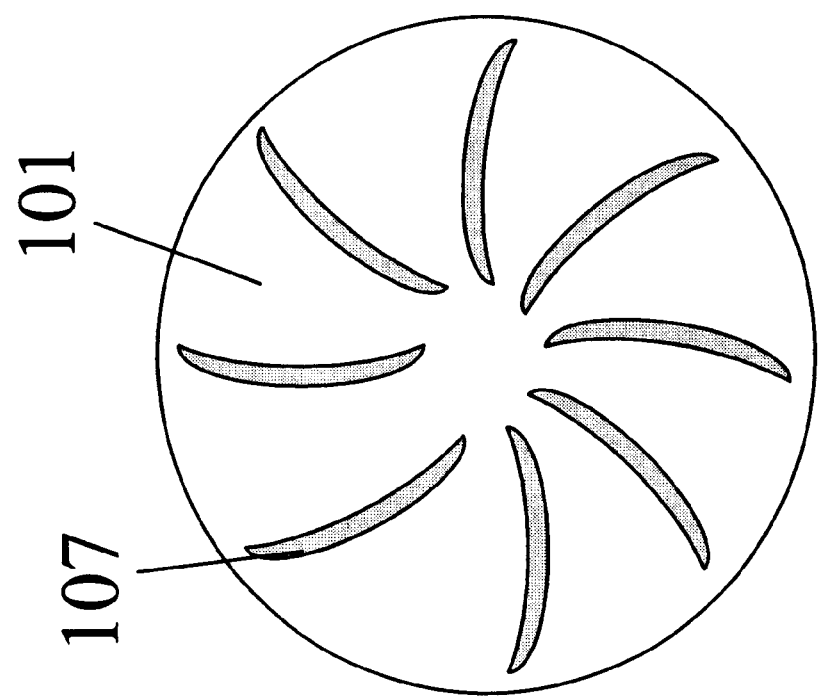
FIG. 4a is a bottom view of a preferred working surface for the top brush.

Referring to FIGS. 4a and 4b, while the top brush 101 is used primarily to clean the wafer's top surface, the bottom brush 103 is used primarily (although it also cleans the wafer's bottom surface) to rotate the wafer 100. It is thus important for the working surface of the bottom brush 103 to have an efficient grip on the wafer 100 to properly rotate the wafer 100. A bottom brush 103 with a plurality of round-shaped nodules (nubbs) 108 separated by open spaces on its working surface have been found to efficiently grip the wafer 100 and provide the necessary rotational motion to the wafer 100. A top brush 101 with a plurality of raised wipers 107 separated by open spaces has been found to efficiently remove contaminates on the wafer's surface.

Figure 5:
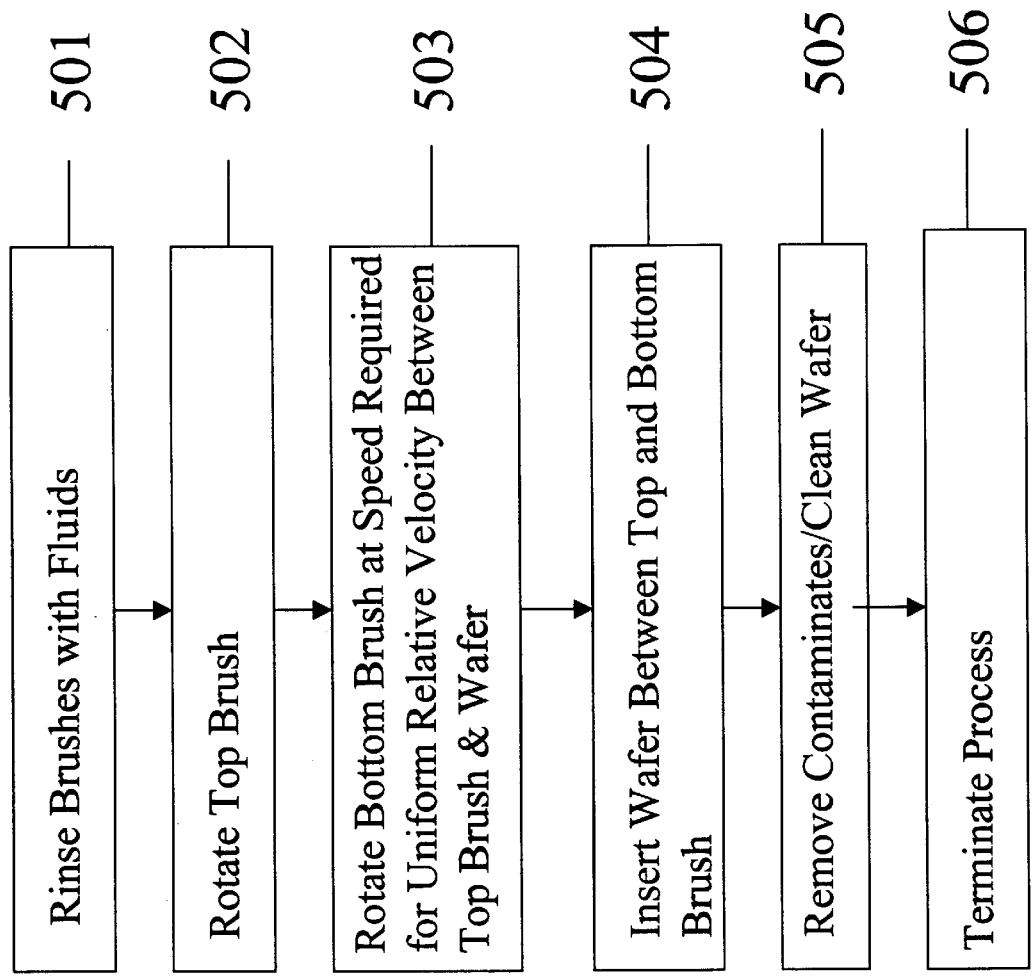
FIG. 5 is a flowchart of a preferred method for implementing the present invention.

An exemplary method of the present invention for cleaning a wafer 100 will now be discussed with reference to the apparatus in FIGS. 1a and 1b and the process flowchart in FIG. 5. After CMP and a buffing step, or other process steps that leave contaminates on the wafer's surface, a wafer 100 may be cleaned in a dual brush cleaning system such as that described above. The PVA brushes 101 and 103 may be kept compliant and contaminates transported away by continually rinsing the brushes 101 and 103 with DI water and, optionally, 2% NH$_4$OH by volume (step 501). The brushes 101 and 103 preferably have been previously positioned opposite of each other such that a wafer 100 inserted between their working surfaces would be under about 1.0 psi. The top brush 101 may be rotated at a first speed (step 502) while the bottom brush 103 may be rotated in the same direction at a second faster speed (step 503) that results in the wafer 100 rotating at the same speed as the top brush 101. Specifically, a top brush rotation speed of about 110 rpm and a bottom brush rotation speed of about 300 rpm have been found to produce the desired condition of a uniform relative velocity between the top brush 101 and the wafer 100. A wafer 100 may be inserted between the top brush 101 and the bottom brush 103 for a period of time, up to 80 seconds or even longer, to produce the desired level of cleanliness (step 505). The wafer may then be withdrawn from between the top brush 101 and the bottom brush 103 (step 506).

The wafer 100 is preferably then dried with remaining loose contaminates removed from the surface. This may be accomplished by rinsing the wafer with DI water and then spinning the wafer (preferably at a speed faster than 1000 rpm) in a spin-rinse dryer (not shown) to remove any remaining fluids and contaminates on the surface by centrifugal force.

Although the foregoing description sets forth a preferred exemplary embodiment and method of operation of the invention, the scope of the invention is not limited to this specific embodiment or described method of operation. Modification may be made to the specific form and design of the invention without departing from its spirit and scope as expressed in the following claims. For example, although the present invention was described using a wafer 100 as the described workpiece, any number of workpieces may also be cleaned using the present invention.

I claim:

1. An apparatus for cleaning a workpiece in a dual brush cleaning system comprising:
    a) a top brush with a working surface;
    b) means for rotating the top brush at a first speed;
    c) a bottom brush with a working surface positioned adjacent the working surface of the top brush; and
    d) means for rotating the bottom brash at a second speed, the second speed being faster than the first speed and sufficient to rotate a workpiece placed between the top and bottom brushes so that there is a substantially uniform relative velocity between the top brush and a surface of the workpiece.

2. An apparatus for cleaning a workpiece as in claim 1, wherein the second speed is about three times that of the first speed.

3. An apparatus for cleaning a workpiece as in claim 1, wherein the first speed is about 110 rpm and the second speed is about 300 rpm.

4. An apparatus for cleaning a workpiece as in claim 1, wherein the second speed of the bottom brush is sufficient to rotate a workpiece placed between the top and bottom brush at about the same speed as the first speed.

5. An apparatus for cling a workpiece as in claim 1, wherein the top and bottom brushes have different topographies on their working surfaces.

6. An apparatus for cleaning a workpiece as in claim 5, wherein the bottom brush's working surface is covered by a plurality of nubbs.

7. An apparatus for cleaning a workpiece as in claim 1, wherein the top and bottom brushes comprise PVA.

8. An apparatus for cleaning a workpiece as in claim 7, wherein the top and bottom brushes are positioned such that a workpiece placed between them is under about 3.5 psi.

* * * * *